(12) United States Patent
Chen et al.

(10) Patent No.: US 11,404,096 B2
(45) Date of Patent: Aug. 2, 2022

(54) WORDLINE DECODER CIRCUITRY

(71) Applicant: Arm Limited, Cambridge (GB)

(72) Inventors: Andy Wangkun Chen, Austin, TX (US); Jungtae Kwon, San Jose, CA (US); Nicolaas Klarinus Johannes Van Winkelhoff, Villard-Bonnot (FR)

(73) Assignee: Arm Limited, Cambridge (GB)

( * ) Notice: Subject to any disclaimer, the term of this patent is extended or adjusted under 35 U.S.C. 154(b) by 28 days.

(21) Appl. No.: 16/213,832

(22) Filed: Dec. 7, 2018

(65) Prior Publication Data
US 2020/0185014 A1    Jun. 11, 2020

(51) Int. Cl.
*G11C 8/10*     (2006.01)
*G11C 8/08*     (2006.01)
*G11C 11/418*   (2006.01)
*G11C 11/16*    (2006.01)

(52) U.S. Cl.
CPC .............. *G11C 8/10* (2013.01); *G11C 8/08* (2013.01); *G11C 11/1657* (2013.01); *G11C 11/418* (2013.01)

(58) Field of Classification Search
CPC .... G11C 8/10; G11C 8/12; G11C 8/06; G11C 11/418; G11C 11/1657; G11C 8/08; G11C 16/08; H03K 19/20
See application file for complete search history.

(56) References Cited

U.S. PATENT DOCUMENTS

| | | | | |
|---|---|---|---|---|
| 5,097,450 A * | 3/1992 | Toda | ......................... | G11C 8/12 365/230.03 |
| 5,781,497 A * | 7/1998 | Patel | ........................ | G11C 8/10 365/189.11 |
| 6,320,814 B1 * | 11/2001 | Susuki | ...................... | G11C 8/00 365/230.03 |
| 7,502,276 B1 * | 3/2009 | Behrends | .................. | G11C 8/10 365/154 |
| 2002/0181315 A1 * | 12/2002 | Lee | ........................... | G11C 8/12 365/230.06 |
| 2003/0231535 A1 * | 12/2003 | Pfeiffer | ............... | G11C 11/4087 365/200 |
| 2006/0126417 A1 * | 6/2006 | Akiyoshi | ............... | G11C 5/063 365/230.03 |
| 2007/0217262 A1 * | 9/2007 | Sachdev | .................. | G11C 8/10 365/185.16 |
| 2013/0322162 A1 * | 12/2013 | Lee | ..................... | G11C 11/1675 365/158 |

* cited by examiner

*Primary Examiner* — Jay W. Radke
(74) *Attorney, Agent, or Firm* — Pramudji Law Group PLLC; Ari Pramudji

(57) ABSTRACT

Various implementations described herein refer to an integrated circuit having a memory cell array with a first number of rows and a second number of rows. The integrated circuit may include a first pre-decoder that receives a row address and selects a first row from the first number of rows based on the row address. The integrated circuit may include a second pre-decoder that receives the row address from the first pre-decoder and selects a second row from the second number of rows based on the row address received from the first pre-decoder. The integrated circuit may include a single row decoder that receives the row address and selects either the first row or the second row based on a row selection bit from the row address.

19 Claims, 10 Drawing Sheets

WORDLINE DECODER CIRCUITRY

BACKGROUND

This section is intended to provide information relevant to understanding various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Generally, increasing a range of supported memory density in modern memory compilers may be limited by required design efforts and performance changes of memory density changes. Due to these limitations, the maximum row numbers per bit line may be limited to a particular number, such as 256. There exists a need to provide for increasing memory density up to 1024 rows per bitline with minimal extra design effort.

BRIEF DESCRIPTION OF THE DRAWINGS

Implementations of various techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein refer to and are directed to wordline decoder circuitry. For instance, the various schemes and techniques described herein are related to area efficient, scalable wordline decoder designs that provide a way to design ultra-high density memory, and design techniques described herein are easily scalable to support large memory sizes. Therefore, increasing memory density may include doubling memory density by doubling row numbers with a fixed column number.

Various implementations of wordline decoder circuitry will now be described in greater detail herein with reference to FIGS. 1-5.

Figure 1:
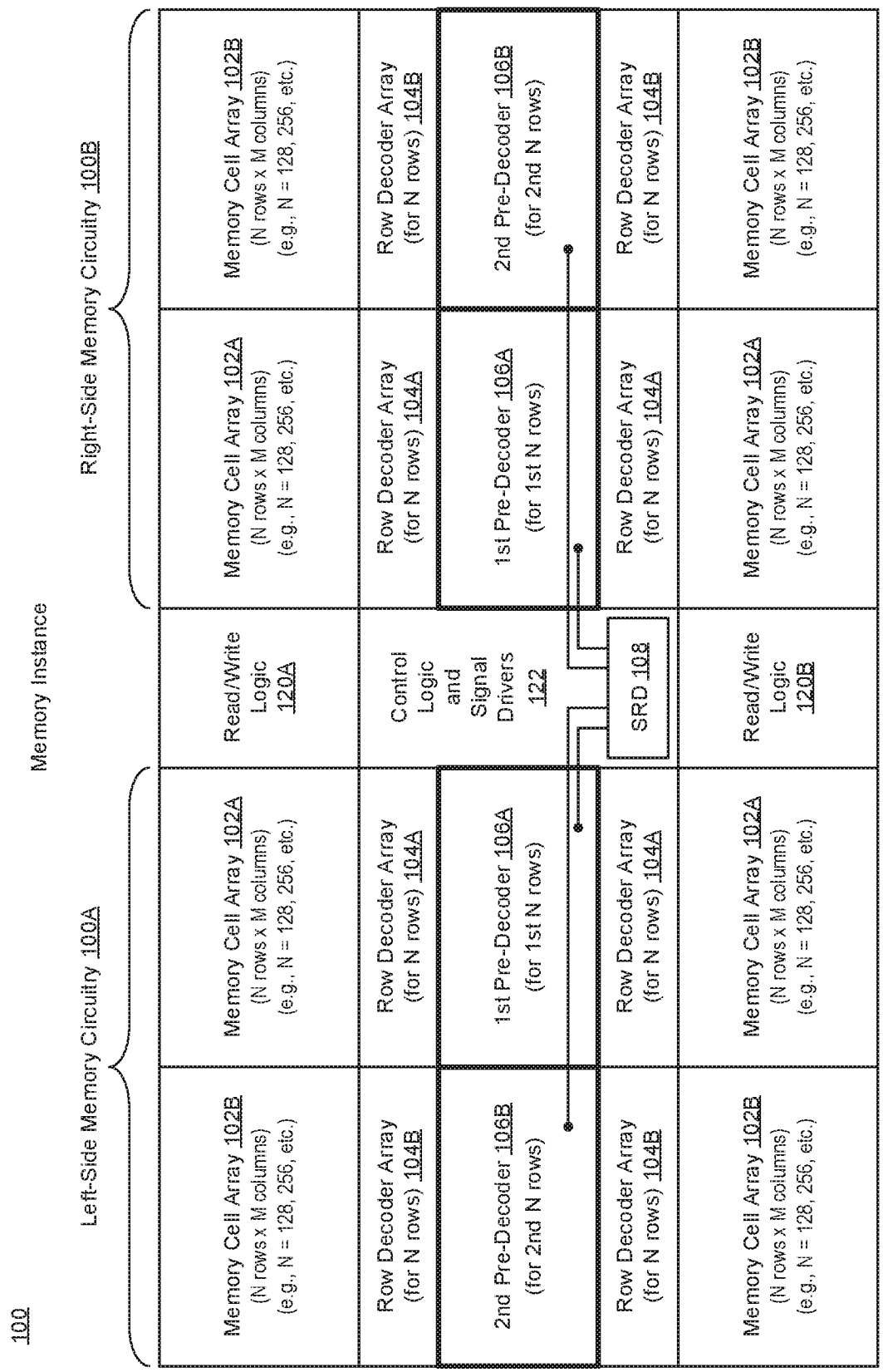
FIG. 1 illustrates a diagram of a memory instance in accordance with various implementations described herein.

FIG. 1 illustrates a block diagram of a memory instance 100 in accordance with various implementations described herein. In this instance, the memory instance 100 may be implemented as high-density (core circuitry having left-side memory circuitry 100A along with right-side memory circuitry 100B.

In some implementations, the memory instance 100 in FIG. 1 may provide for increasing memory density by using two pre-decoders in each of the left-side memory circuitry 100A and the right-side memory circuitry 100B: e.g., one pre-decoder 106A for a lower-half of memory in each 100A, 100B and another pre-decoder 106B for an upper-half of memory in each 100A, 100B. The logic of these two pre-decoders 106A, 106B (in each 100A, 100B) may be similar, and only one of the pre-decoders may be selected by a row address bit. Also, since critical timings for the two pre-decoders may be similar, extra design effort to check timing margins for the increased density memory may not be needed. One advantage to this design may refer to less area overhead, and also, this design may be simpler to implement scalable designs with less design effort, wherein scalable refers to supporting larger numbers of rows, e.g., 768 rows and 1024 rows. However, any number of rows may be used.

As shown in FIG. 1, each memory circuitry 100A, 100B may include multiple memory cell arrays 102A, 102B arranged with a number (N) of rows and a number (M) of columns. The left-side memory circuitry 100A may include a first memory cell array 102A and a second memory cell array 102B, and the right-side memory circuitry 100B may also include another first memory cell array 102A and another second memory cell array 102B. In some instances, the number (N) of rows may include 256 rows. However, in various other instances, any number (N) of rows may be used, such as, e.g., 64, 128, 256, 512, 1024, etc. Also, in some instances, each memory circuitry 100A, 100B may provide for decoding 2×(N)=512 rows, e.g., when N=256.

In some implementations, each memory cell array 102A, 102B may include multiple memory cells, and each memory cell may be referred to as a bitcell, wherein each bitcell may be configured to store at least one data bit value (e.g., data value related to a logical '0' or '1'). Also, each memory cell array 102A, 102B may include any number of bitcells arranged in various configurations, such as, e.g., a two-dimensional (2D) bitcell array having any number (N) of rows (N rows) and any number (M) of columns (M columns), which may be arranged in a 2D grid pattern with 2D indexing capabilities. Also, each memory cell may be implemented with random access memory (RAM), and/or some other type of volatile type memory. For instance, each bitcell may include a multi-transistor static RAM (SRAM) cell, including various types of SRAM cells, such as, e.g., 6T CMOS SRAM and/or any other type of complementary MOS (CMOS) SRAM cells, such as, e.g., 4T, 8T, 10T, or more transistors per bit. In another instance, each bitcell may include a magneto-resistive RAM (MRAM) cell. Also, in some instances, the memory circuitry 100A, 100B may operate at a supply voltage level VDD with a voltage range that varies with technology.

As shown in FIG. 1, each memory circuitry 100A, 100B may include multiple row decoders 104A, 104B that may be implemented as wordline (WL) row decoders for accessing each of the memory cells via a selected wordline (WL) that is driven by control logic and signal drivers 122 in conjunction with read/write logic circuitry 120A, 120B. In this instance, the multiple row decoders 104A, 104B may include a first row decoder array 104A and second row decoder array 104B. In addition, each memory circuitry 100A, 100B may include multiple pre-decoders 106A, 106B, e.g., including a first pre-decoder 106A for the number (N) of rows and a second pre-decoder 106B for another number (N) of rows. Also, in this instance, the control logic 122 may include a single row decoder (SRD) 108 that may be used in conjunction with the pre-decoders 106A, 106B to select (or determine selection of) a single row from the memory cell arrays, 102A, 102B of each memory circuitry 100A, 100B. In various implementations, any number of pre-decoders may be used. For instance, as shown in FIGS. 4A-4D, additional pre-decoders (e.g., 106C, 106D) may be used to expand memory capability, e.g., the number of columns may be expanded to accommodate any additional rows of memory. This subject matter and various other features of the decoder circuitry will be described herein below.

Figure 2A:
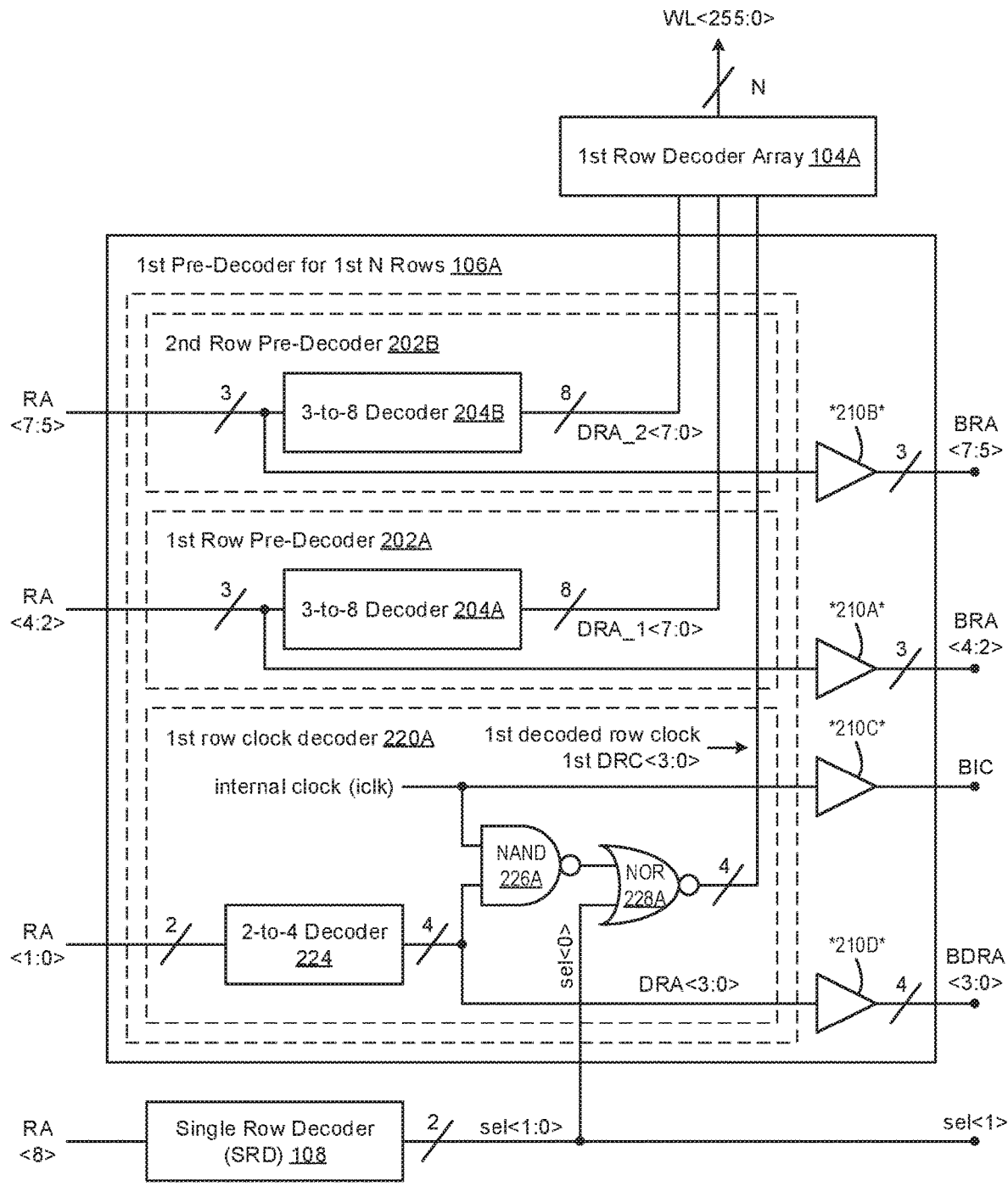
FIGS. 2A-2B illustrate a diagram of pre-decoder circuitry in accordance with various implementations described herein.
Figure 2B:
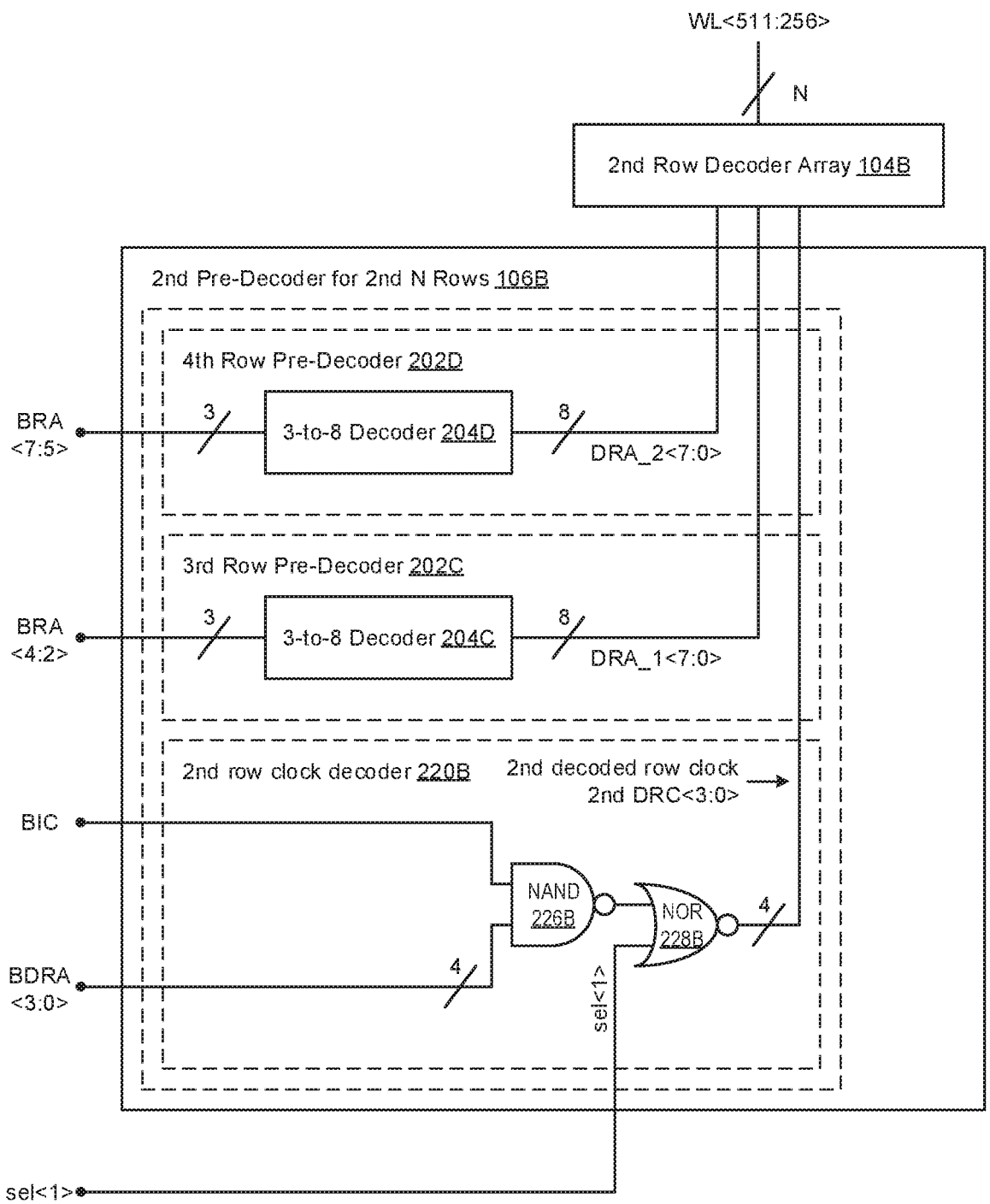

FIGS. 2A-2B illustrate a diagram of pre-decoder circuitry 200 in accordance with various implementations described herein. In particular, FIG. 2A shows a first part 200A of the pre-decoder circuitry 200, and FIG. 2B shows a second part 200B of the pre-decoder circuitry 200. As described herein, the pre-decoder circuitry 200 of FIGS. 2A-2B may be implemented as the first and second row decoder arrays 104A, 104B, the first and second pre-decoders 106A, 106B, and the single row decoder 108 of FIG. 1 along with the memory cell arrays 102A, 102B. In some instances, as described herein, when the number (N) of rows is 256 rows, the pre-decoder circuitry 200 may provide for decoding 512 rows, when N=256. However, any number (N) of rows may be used, such as, e.g., 64, 128, 256, 512, 1024, etc.

As shown in FIGS. 2A-2B, the pre-decoder circuitry 200 may include multiple pre-decoders including a first pre-decoder 106A in FIG. 2A and a second pre-decoder 106B in FIG. 2B. The first pre-decoder 106A may receive a row address (RA<7:0>) and may select a first row from a first number of rows 102A (of FIG. 1) based on the row address (RA<7:0>). In this instance, the row address (RA<7:0>) may include a multi-bit address signal, such as, e.g., an 8-bit address signal. Also, the second pre-decoder 106B may receive the row address from the first pre-decoder 106A (as a buffered row address) and may select a second row from the second number of rows 102B (of FIG. 1) based on the row address (RA<7:0>) received from the first pre-decoder 106A. In this instance, the memory cell array 102A, 102B (of FIG. 1) may include the first number of rows (e.g., N rows 102A) and the second number of rows (e.g., N rows 102B). Also, in this instance, the pre-decoder circuitry 200 may include the single row decoder (SRD) 108 that receives the row address (RA<7:0>), identifies an 8th bit (RA<8>) from the 8-bit row address (RA<7:0>), and selects either the first row or the second row based on a decoded row selection bit (sel<1:0>) from the row address (RA<7:0>). In some instances, prior to input into the SRD 108, the decoded row selection bit (sel<1:0>) may be taken from the 8th bit (RA<8>) of the 8-bit row address (RA<7:0>). As such, the single row decoder (SRD) 108 may be implemented as a 1-to-2 decoder.

In some instances, the memory cell array (102A, 102B) may be subdivided into multiple arrays including a first array 102A (e.g., first number of rows 102A) and a second array (e.g., second number of rows 102B) that is separate from the first array. The first array 102A may include the first number of rows (N rows 102A), and the second array 102B may include the second number of rows (N rows 102B). Also, each memory cell array 102A, 102B may be subdivided into multiple partitions including a first partition and a second partition that is separate from the first partition. Also, the first partition of rows and the second partition of rows may be similar is size (e.g., two separate partitions of rows are combined to be 256 rows). Further, in some instances, the first number of rows (N rows 102A) may include one-half (or lower-half) of the rows in the memory cell array, and the second number of rows (N rows 102B) may include another one-half (or upper-half) of the rows in the memory cell array.

As shown in FIG. 2A, the first pre-decoder 106A may include a first row pre-decoder 202A that receives a first part (RA<4:2>) of the row address (RA<7:0>), decodes the first part (RA<4:2>) of the row address (RA<7:0>), and provides a decoded first part (DRA_1<7:0>) to the first row decoder array 104A for selecting the first row from the first partition of the first number of rows 102A. Also, the first pre-decoder 106A may include a second row pre-decoder 202B that receives a second part (RA<7:5>) of the row address (RA<7:0>), decodes the second part (RA<7:5>) of the row address (RA<7:0>), and provides a decoded second part (DRA_2<7:0>) to the first row decoder array 104A for selecting the first row from the second partition of the first number of rows 102A.

In some instances, the first row pre-decoder 202A may include a decoder 204A that receives the first part (RA<4:2>) of the row address (RA<7:0>), decodes the first part (RA<4:2>) of the row address (RA<7:0>), and provides the decoded first part (DRA_1<7:0>) to the first row decoder array 104A. The decoder 204A may be used for addressing and/or selecting at least one row from the first memory cell array 102A (e.g., at least one row from the first partition of the N rows 102A). The decoder 204A may be implemented as a 3-to-8 decoder, such as, e.g., a 3-bit to 8-bit decoder. In this instance, the first part (RA<4:2>) of the row address (RA<7:0>) may include a multi-bit address signal, such as, e.g., a 3-bit address signal, and the decoder 204A may receive the 3-bit address signal and provide the decoded first part (DRA_1<7:0>) as a decoded multi-bit address signal, such as, e.g., an 8-bit address signal.

Further, the second row pre-decoder 202B may include another decoder 204B that receives the second part (RA<7:5>) of the row address (RA<7:0>), decodes the second part (RA<7:5>) of the row address (RA<7:0>), and provides the decoded second part (DRA_2<7:0>) to the first row decoder array 104A. The decoder 204B may be used for addressing and/or selecting at least one row from the first memory cell array 102A (e.g., at least one row from the second partition of the N rows 102A). The decoder 204B may be implemented as a 3-to-8 decoder, such as, e.g., a 3-bit to 8-bit decoder. In this instance, the second part (RA<7:5>) of the row address (RA<7:0>) may include a multi-bit address signal, such as, e.g., a 3-bit address signal, and the decoder 204B may receive the 3-bit address signal and provide the decoded second part (DRA_2<7:0>) as a decoded multi-bit address signal, such as, e.g., an 8-bit address signal.

Also, the first pre-decoder 106A may include a first row clock decoder 220A that receives a third part (RA<1:0>) of the row address (RA<7:0>), receives the row selection bit (sel<1:0>) from the single row decoder (SRD) 108, and provides a first decoded row clock (1st DRC<3:0>) to the first row decoder array 104A based on and an internal clock (iclk). The first row clock decoder 220A may decode the third part (RA<1:0>) of the row address (RA<7:0>) and may provide a decoded third part (DRA<3:0>) associated with the row address (RA<0>). In this instance, the row selection bit (sel<1:0>) may refer to a logic 0, such as, e.g., in a form of sel<0>.

In some implementations, the first row clock decoder 220A may include at least one decoder 224 and one or more logic gates 226A, 228A. The first row clock decoder 220A may receive the third part (RA<1:0>) of the row address (RA<7:0>) and provide the first decoded row clock (1st DRC<3:0>). The decoder 224 may be implemented as a 2-to-4 decoder, such as, e.g., a 2-bit to 4-bit decoder. Also, in this instance, the third part (RA<1:0>) of the row address (RA<7:0>) may include a multi-bit address signal, such as, e.g., a 2-bit address signal, and the decoder 224 may receive the 2-bit address signal and provide the decoded third part (DRA<3:0>) as a decoded multi-bit address signal, such as, e.g., a 4-bit address signal. The one or more logic gates 226A, 228A may include a NAND gate 226A and a NOR gate 228A with each logic gate having multiple inputs and multiple outputs. In this instance, the NAND gate 226A may receive the decoded third part (DRA<3:0>) from the decoder 224, receive the internal clock (iclk), and provide an output to the NOR gate 228A. Also, the NOR gate 228A may receive the output from the NAND gate 226A, receive the row selection bit (sel<1:0>) from the single row decoder (SRD) 108, and provide an output signal (e.g., the first decoded row clock: 1st DRC<3:0>) to the first row decoder array 104A.

As shown in FIG. 2A, the first row decoder array 104A receives the decoded first part (DRA_1<7:0>) from the first row pre-decoder 202A, receives the decoded second part (DRA_2<7:0>) from the second row pre-decoder 202B, receives the first decoded row clock signal (1st DRC<3:0>) from the first row clock decoder 220A, and provides a first wordline selection signal (WL<255:0>) to select the first row based on the row selection bit (sel<1:0>) from the row address (RA<7:0>).

The first pre-decoder 106A may include multiple buffers, which are optional to implement. For instance, the first pre-decoder 106A may include a first row address buffer 210A (optional) that receives the first part (RA<4:2>) of the row address (RA<7:0>) from the first row pre-decoder 202A, optionally buffers the first part (RA<4:2>) of the row address (RA<7:0>), and provides a buffered first part (BRA<4:2>) to the second pre-decoder 106B. The first pre-decoder 106A may include a second row address buffer 210B (optional) that receives the second part (RA<7:5>) of the row address (RA<7:0>) from the second row pre-decoder 202B, optionally buffers the first part (RA<7:5>) of the row address (RA<7:0>), and provides a buffered second part (BRA<7:5>) to the second pre-decoder 106B.

Further, the first pre-decoder 106A may include a row clock buffer 210C that receives the internal clock (iclk), buffers the internal clock (iclk), and provides a buffered internal clock (BIC<2:0>) to the second pre-decoder (106B). Also, the first pre-decoder 106A may include a third row address buffer 210D (optional) that receives the decoded third part (DRA<3:0>) of the row address (RA<7:0>), buffers the decoded third part (DRA<3:0>) that is associated with the row address (RA<7:0>), and provides a buffered and decoded third part (BDRA<3:0>) to the second pre-decoder 106B. The row clock buffer 210C may be optionally implemented and is therefore optional.

As shown in FIG. 2B, the second pre-decoder 106B may include a third row pre-decoder 202C that receives the buffered first part (BRA<4:2>) from the first pre-decoder 106A, decodes the buffered first part (BRA<4:2>), and provides the decoded first part (DRA_1<7:0>) to a second row decoder array 104B for selecting the second row from a third partition of the second number of rows 102B. The second pre-decoder 106B may include a fourth row pre-decoder 202D that receives the buffered second part (BRA<7:5>) from the first pre-decoder 106A, decodes the second part (BRA<7:5>), and provides a decoded second part (DRA_2<7:0>) to the second row decoder array 104B for selecting the second row from a fourth partition of the second number of rows 102B.

In some instances, the third row pre-decoder 202C may include a decoder 204C that receives the buffered first part (BRA<4:2>) of the row address (RA<7:0>), decodes the buffered first part (BRA<4:2>) of the row address (RA<7:0>), and provides the decoded first part (DRA_1<7:0>) to the second row decoder array 104B. The decoder 204C may be used for addressing and/or selecting at least one row from the third partition of the second memory cell array 102B (e.g., at least one row from the third partition of the N rows 102B). The decoder 204C may be implemented as a 3-to-8 decoder, such as, e.g., a 3-bit to 8-bit decoder. In this instance, the first part (RA<4:2>) of the row address (RA<7:0>) may include a multi-bit address signal, such as, e.g., a 3-bit address signal, and the decoder 204A may receive the 3-bit address signal and provide the decoded first part (DRA_1<7:0>) as a decoded multi-bit address signal, such as, e.g., an 8-bit address signal.

Further, the fourth row pre-decoder 202D may include another decoder 204D that receives the buffered second part (BRA<7:5>) of the row address (RA<7:0>), decodes the buffered second part (BRA<7:5>) of the row address (RA<7:0>), and provides the decoded second part (DRA_2<7:0>) to the second row decoder array 104B. The decoder 204D may be used for addressing and/or selecting at least one row from the fourth partition of the second memory cell array 102B (e.g., at least one row from the fourth partition of the N rows 102B). In some instances, the decoder 204D may be implemented as a 3-to-8 decoder, such as, e.g., a 3-bit to 8-bit decoder. In this instance, the second part (RA<7:5>) of the row address (RA<7:0>) may include a multi-bit address signal, such as, e.g., a 3-bit address signal, and the decoder 204D may receive the 3-bit address signal and provide the decoded second part (DRA_2<7:0>) as a decoded multi-bit address signal, such as, e.g., an 8-bit address signal.

The second pre-decoder 106B may include a second row clock decoder 220B that receives the buffered internal clock (BIC<2:0>) from the first pre-decoder 106A, receives the buffered and decoded third part (BDRA<3:0>) of the row address (RA<7:0>), receives the row selection bit (sel<1:0>) from the single row decoder (SRD) 108, and provides a second decoded row clock (2nd DRC<3:0>) to the second row decoder array 104B based on the buffered internal clock (BIC<2:0>). In this instance, the row selection bit (sel<1:0>) may refer to a logic 1, such as, e.g., in a form of sel<1>.

In some implementations, the second row clock decoder 220B may include one or more logic gates 226B, 228B. The one or more logic gates 226B, 228B may include a NAND gate 226B and a NOR gate 228B with each logic gate having multiple inputs and multiple outputs. In this instance, the NAND gate 226B may receive the buffered internal clock (BIC<2:0>) from the first pre-decoder 106A, receive the buffered and decoded third part (BDRA<3:0>) of the row address (RA<7:0>) from the first pre-decoder 106A, and provide an output to the NOR gate 228B. Also, the NOR gate 228B may receive the output from the NAND gate 226B, receive the row selection bit (sel<1:0>) from the single row decoder (SRD) 108, and provide an output signal (e.g., the second decoded row clock: 2nd DRC<3:0>) to the second row decoder array 104B.

In some implementations, as shown in FIG. 2B, the second row decoder array 104B receives the decoded first part (DRA_1<7:0>) from the third row pre-decoder 202C, receives the decoded second part (DRA_2<7:0>) from the fourth row pre-decoder 202D, receives the second decoded row clock signal (2nd DRC<3:0>) from the second row clock decoder 220B, and provides a second wordline selection signal (WL<511:256>) to select the second row based on the row selection bit (sel<1:0>).

Figure 3A:
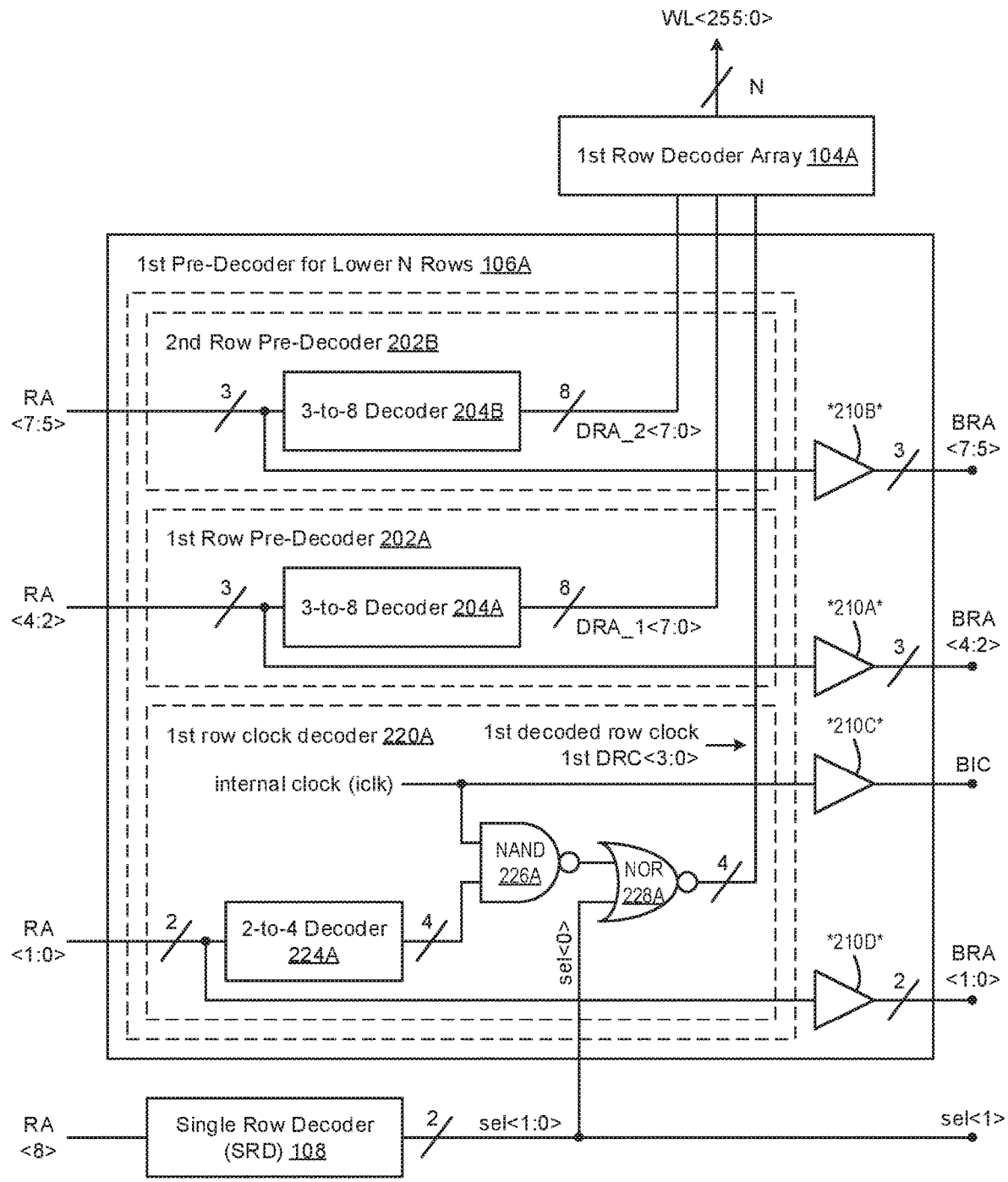
FIGS. 3A-3B illustrate another diagram of pre-decoder circuitry in accordance with various implementations described herein.
Figure 3B:
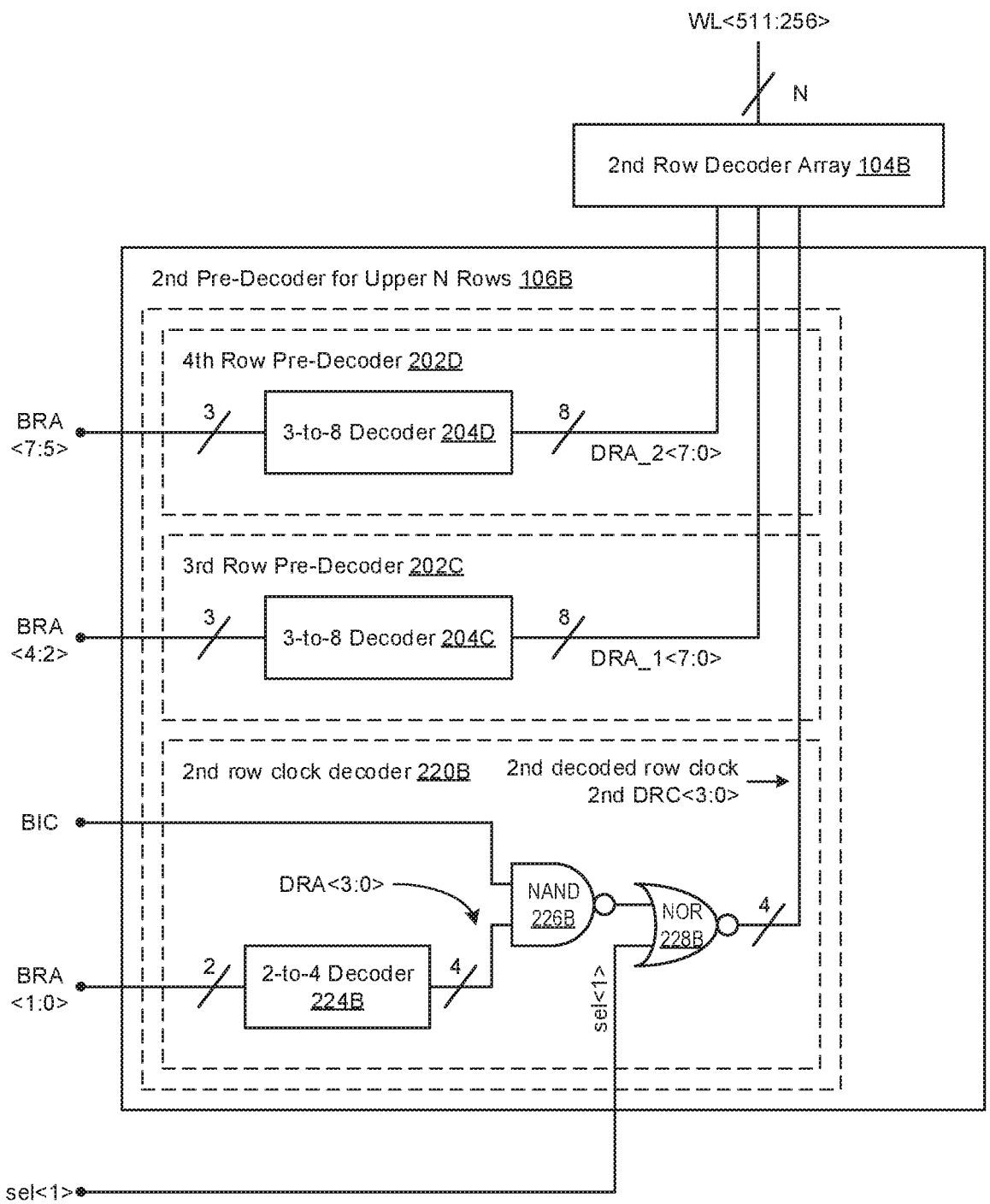

FIGS. 3A-3B illustrate a diagram of pre-decoder circuitry 300 in accordance with various implementations described herein. In particular, FIG. 3A shows a first part 300A of the pre-decoder circuitry 300, and FIG. 3B shows a second part 300B of the pre-decoder circuitry 300. As described herein, the pre-decoder circuitry 300 of FIGS. 3A-3B may be implemented as the first and second row decoder arrays 104A, 104B, the first and second pre-decoders 106A, 106B, and the single row decoder 108 of FIG. 1 along with the memory cell arrays 102A-102D. Further, the pre-decoder circuitry 300 in FIGS. 3A-3B are similar in scope, function and operation to the pre-decoder circuitry 200 in FIGS. 2A-2B, except for arrangement of the first row clock decoder 220A and the second row clock decoder 220B, as described in detail herein below. In some instances, when the number (N) of rows is 256 rows, the pre-decoder circuitry 300 may provide for decoding 512 rows, when N=256. However, any number (N) of rows may be used, such as, e.g., 64, 128, 256, 512, 1024, etc.

As shown in reference to FIG. 3A, the first row clock decoder 220A includes the decoder 224 (of FIG. 2A) as a first decoder 224A. In this instance, the first decoder 224A receives the third part (RA<1:0>) of the row address (RA<7:0>). In addition, the first row clock decoder 220A includes the third row address buffer 210D (optional) that receives the third part (RA<1:0>) of the row address (RA<7:0>), buffers the third part (RA<1:0>) of the row address (RA<7:0>), and provides a buffered third part (BRA<1:0>) to the second pre-decoder 106B. In this instance, the third part (RA<1:0>) of the row address (RA<7:0>) may include a multi-bit address signal, such as, e.g., a 2-bit address signal, and the third row address buffer 210D (optional) may receive the 2-bit address signal (BRA<1:0>) and provide the decoded third part (DRA<1:0>) as a decoded multi-bit address signal, such as, e.g., a 2-bit address signal. As described herein, one or more or all of the buffers 210A, 210B, 210C, 210D are optional.

In some implementations, as shown in FIG. 3B, the second pre-decoder 106B may include the second row clock decoder 220B. In this instance, the second row clock decoder 220B may include a second decoder 224B and one or more logic gates 226B, 228B. As shown, the second row clock decoder 220B may receive the buffered internal clock (BIC<2:0>), receive the buffered third part (BRA<1:0>) of the row address (RA<7:0>), and provide the second decoded row clock (2nd DRC<3:0>). The second decoder 224B may be implemented as a 2-to-4 decoder, such as, e.g., a 2-bit to 4-bit decoder. Also, in this instance, the buffered third part (BRA<1:0>) of the row address (RA<7:0>) may include a multi-bit address signal, such as, e.g., a 2-bit address signal, and the second decoder 224B may receive the 2-bit address signal and provide the decoded third part (DRA<3:0>) to as a decoded multi-bit address signal, such as, e.g., a 4-bit address signal. The one or more logic gates 226B, 228B may include a NAND gate 226B and a NOR gate 228B with each logic gate having multiple inputs and multiple outputs. The NAND gate 226B receives the decoded third part (DRA<3:0>) from the second decoder 224B, receives the buffered internal clock (BIC<2:0>), and provides an output to the NOR gate 228B. Also, in this instance, the NOR gate 228B receives the output from the NAND gate 226B, receives the row selection bit (sel<1:0>) from the single row decoder (SRD) 108, and provides an output signal (e.g., the second decoded row clock: 2nd DRC<3:0>) to the second row decoder array 104B.

Figure 4A:
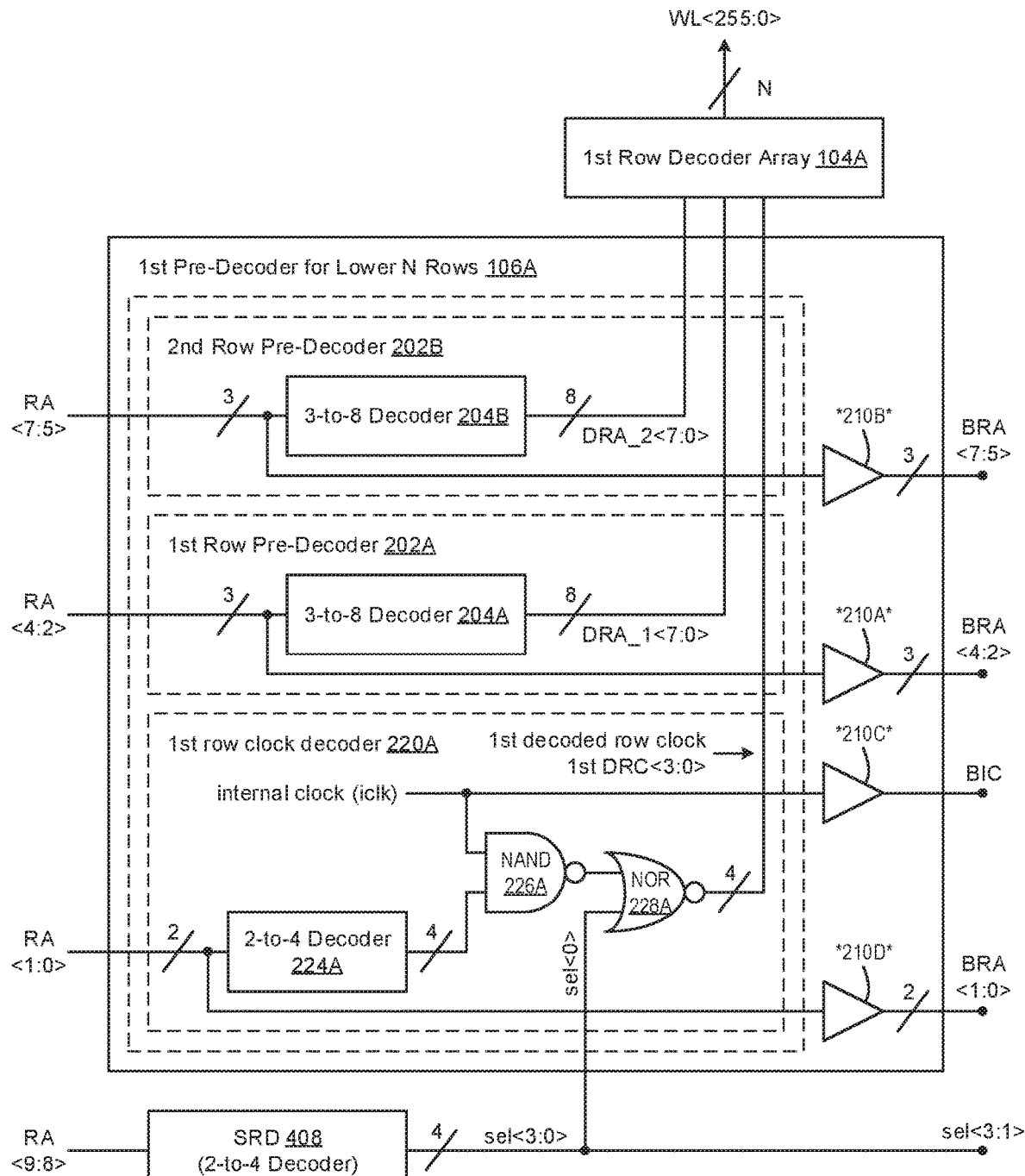
FIGS. 4A-4D illustrate another diagram of pre-decoder circuitry in accordance with various implementations described herein.
Figure 4B:
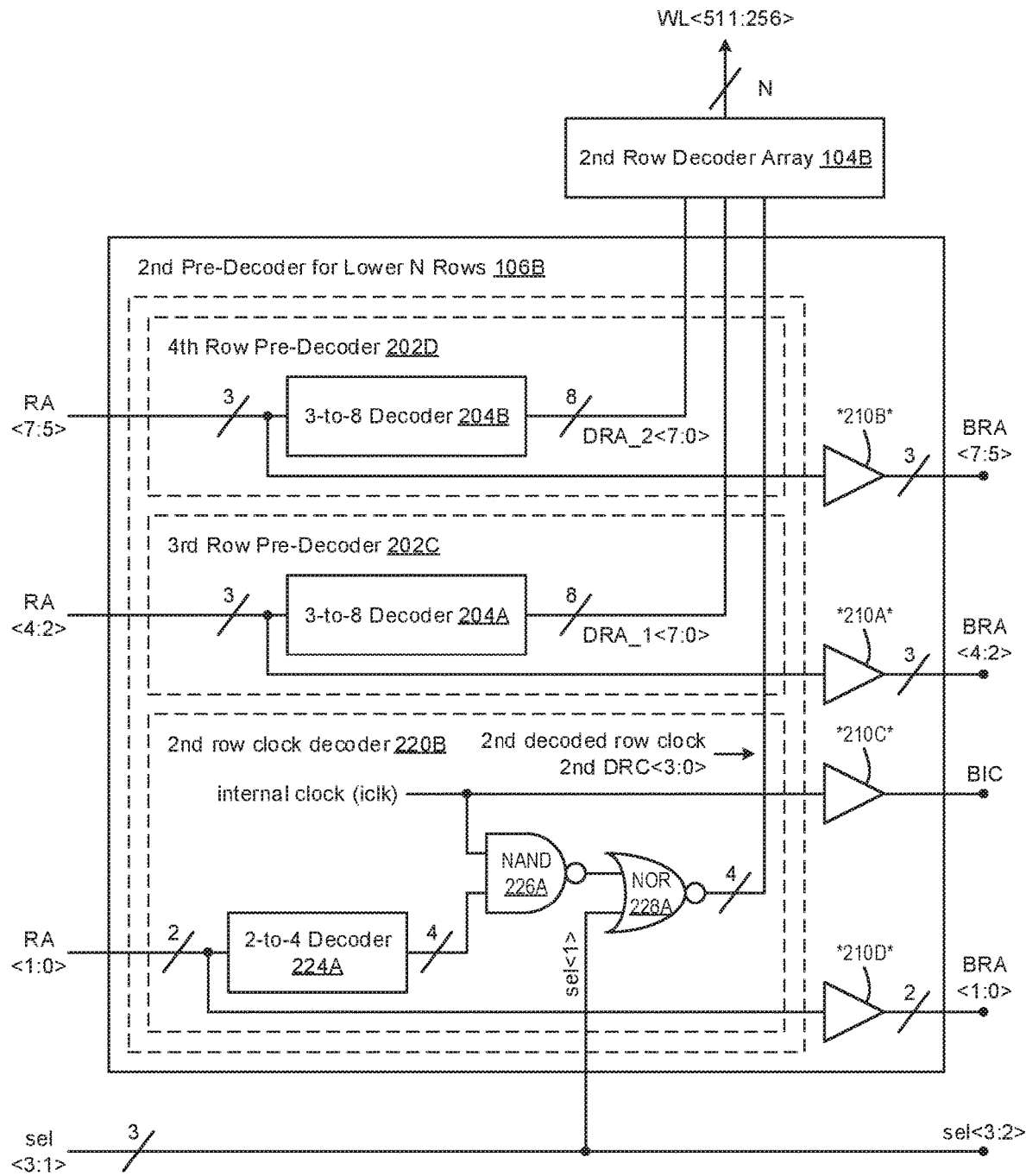
Figure 4C:
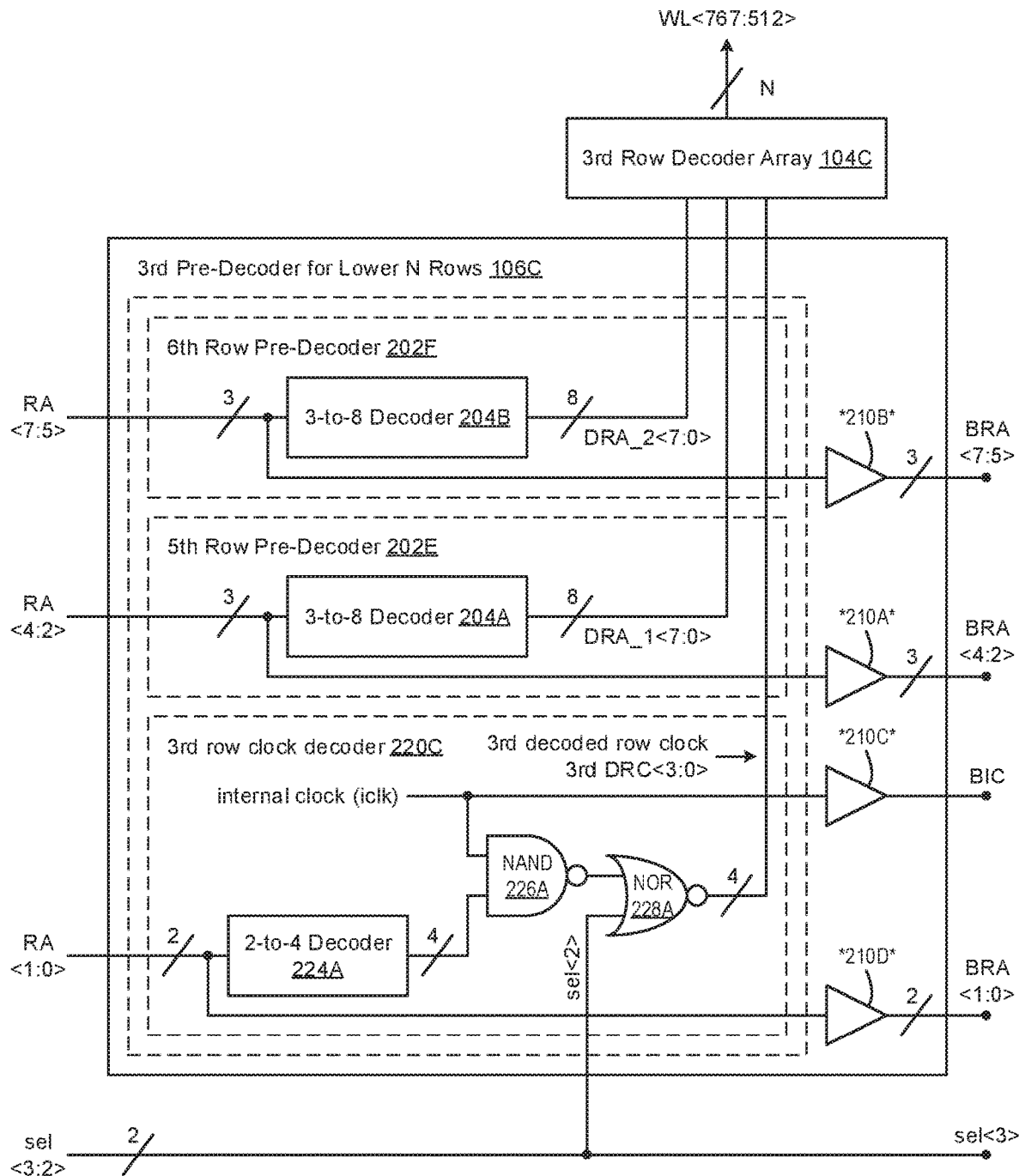
Figure 4D:
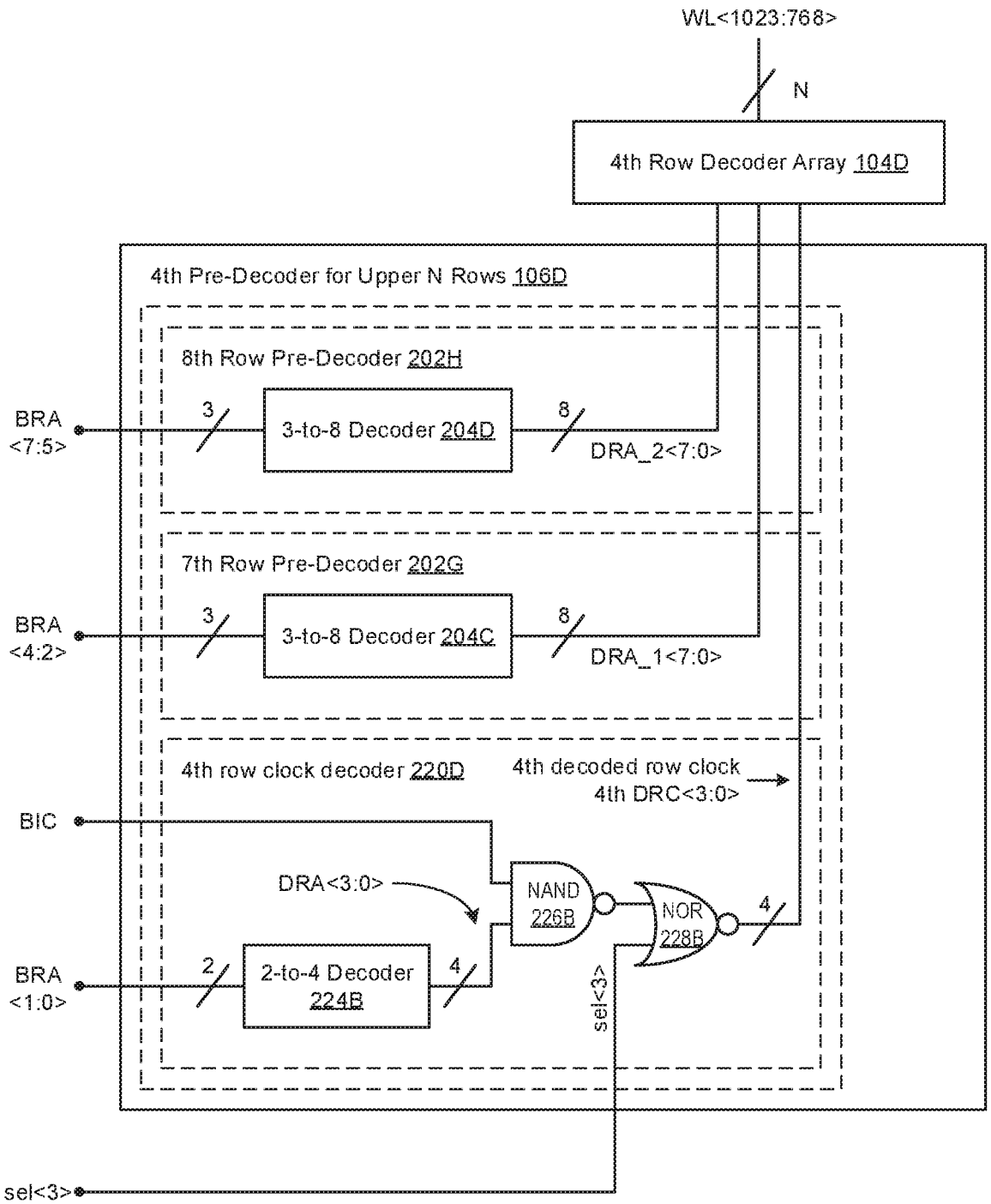

FIGS. 4A-4D illustrate a diagram of pre-decoder circuitry 400 in accordance with various implementations described herein. In particular, FIG. 4A shows a first part 400A of the pre-decoder circuitry 400, FIG. 4B shows a second part 400B of the pre-decoder circuitry 400, FIG. 4C shows a third part 400C of the pre-decoder circuitry 400, and FIG. 4D shows a fourth part 400D of the pre-decoder circuitry 400. As described herein, the first, second and third parts 400A, 400B, 400C of the pre-decoder circuitry 400 in FIGS. 4A-4C may be implemented with a series-coupling of multiple first parts 300A of pre-decoder array 300 of FIG. 3A. Also, the fourth part 400D of pre-decoder circuitry 400 in FIG. 4D may be implemented with the second part 300B of pre-decoder array 300B of FIG. 3B. Thus, the parts 400A, 400B, 400C of the pre-decoder circuitry 400 in FIGS. 4A-4C are similar in scope, function and operation to the first part 300A of the pre-decoder circuitry 300 in FIG. 3A. Also, the parts 400D of the pre-decoder circuitry 400 in FIG. 4D is similar in scope, function and operation to the second part 300B of the pre-decoder circuitry 300 in FIG. 3B, as described in detail herein below. In some instances, when the number (N) of rows is 256 rows, the pre-decoder circuitry 400 with 4× density may provide for decoding 1024 rows, when N=256. However, any number (N) of rows may be used, such as, e.g., 64, 128, 256, 512, 1024, etc.

As shown in FIG. 4A-4D, the pre-decoder circuitry 400 may include multiple pre-decoders 106A, 106B, 106C, 106D that are separate from one another, e.g., including a first pre-decoder 106A, a second pre-decoder 106B, a third pre-decoder 106C, and a fourth pre-decoder 106D. The first pre-decoder 106A may select a first row from multiple first rows of a first bitcell array (e.g., from lower rows 102A, 102B of left-side memory circuitry 100A in FIG. 1). The second pre-decoder 106B may select a second row from multiple second rows of a second bitcell array (e.g., from upper rows 102C, 102D of left-side memory circuitry 100A in FIG. 1). The third pre-decoder 106C may select a third row from multiple third rows of the third bitcell array (e.g., from lower rows 102A, 102B of right-side memory circuitry 100B in FIG. 1). The fourth pre-decoder 106D may select a fourth row from multiple fourth rows of the fourth bitcell array (e.g., from upper rows 102C, 102D of right-side memory circuitry 100A in FIG. 1). The single row decoder (SRD) 408 may select a single row from the four rows, such as, e.g., from the first row, the second row, the third row, or the fourth row based on a row address (RA<9:8>).

As shown in FIG. 4A, the first row decoder array 104A receives the decoded first part (DRA_1<7:0>) from the first row pre-decoder 202A, receives the decoded second part (DRA_2<7:0>) from the second row pre-decoder 202B, receives the first decoded row clock signal (1st DRC<3:0>) from the first row clock decoder 220A, and provides the first wordline selection signal (WL<255:0>) to select the first row based on the row selection bit (sel<1:0>) from the row address (RA<9:8>). The single row decoder (SRD) 408 receives the row address (RA<9:8>), decodes a multi-bit (e.g., 4-bit) row selection signal (sel<3:0>) from the row address (RA<9:8>), and provides a first selection bit (sel<0>) from the row selection signal (sel<3:0>) to the first row clock decoder 220A.

As shown in FIG. 4B, the second row decoder array 104B receives the decoded first part (DRA_1<7:0>) from the third row pre-decoder 202C, receives the decoded second part (DRA_2<7:0>) from the fourth row pre-decoder 202D, receives the second decoded row clock signal (2nd DRC<3:0>) from the second row clock decoder 220B, and provides the second wordline selection signal (WL<511:256>) to select the second row based on the row selection bit (sel<1:0>) from the row address (RA<9:8>). The single row decoder (SRD) 408 receives the row address (RA<9:8>), decodes the multi-bit (e.g., 4-bit) row selection signal (sel<3:0>) from the row address (RA<9:8>), and provides a second selection bit (sel<1>) from the row selection signal (sel<3:0>) to the second row clock decoder 220B.

As shown in FIG. 4C, a third row decoder array 104C receives the decoded first part (DRA_1<7:0>) from a fifth row pre-decoder 202E, receives the decoded second part (DRA_2<7:0>) from a sixth row pre-decoder 202F, receives a third decoded row clock signal (3rd DRC<3:0>) from a third row clock decoder 220C, and provides a third wordline selection signal (WL<767:512>) to select a third row based on the row selection bit (sel<1:0>) from the row address (RA<9:8>). The single row decoder (SRD) 408 receives the row address (RA<9:8>), decodes the multi-bit (e.g., 4-bit) row selection signal (sel<3:0>) from the row address (RA<9:8>), and provides a third selection bit (sel<2>) from the row selection signal (sel<3:0>) to the third row clock decoder 220C.

As shown in FIG. 4D, a fourth row decoder array 104D receives the decoded first part (DRA_1<7:0>) from a seventh row pre-decoder 202G, receives the decoded second part (DRA_2<7:0>) from an eighth row pre-decoder 202H, receives a fourth decoded row clock signal (4th DRC<3:0>) from a fourth row clock decoder 220D, and provides a fourth wordline selection signal (WL<1023:768>) to select a fourth row based on the row selection bit (sel<1:0>) from the row address (RA<9:8>). The single row decoder (SRD) 408 receives the row address (RA<9:8>), decodes the multi-bit (e.g., 4-bit) row selection signal (sel<3:0>) from the row address (RA<9:8>), and provides a fourth selection bit (sel<3>) from the row selection signal (sel<3:0>) to the fourth row clock decoder 220D.

Figure 5:
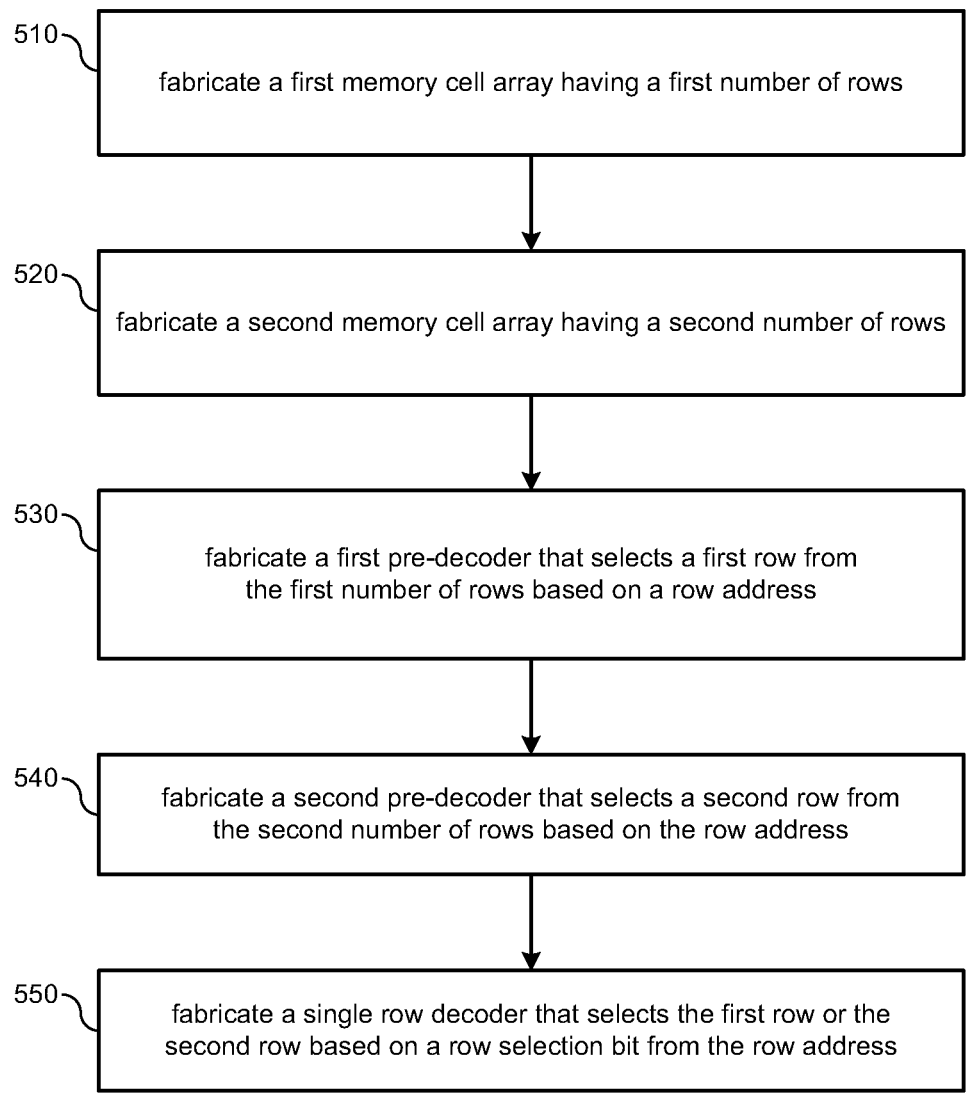
FIG. 5 illustrates a diagram of a method for fabricating pre-decoder circuitry in accordance with various implementations described herein.

FIG. 5 illustrates a block diagram of a method 500 for fabricating pre-decoder circuitry in accordance with various implementations described herein.

It should be understood that even though method 500 may indicate a particular order of operation execution, in some cases, various certain portions of the operations may be executed in a different order, and on different systems. In other cases, additional operations and/or steps may be added to and/or omitted from method 500. Method 500 may be implemented in hardware and/or software. If implemented in hardware, method 500 may be implemented with various circuit components, such as described herein in reference to FIGS. 1-4D. If implemented in software, method 500 may be implemented as a program or software instruction process that may be used for fabricating pre-decoder circuitry as described herein. Also, if implemented in software, various instructions related to implementing method 500 may be stored in memory and/or a database. For instance, a computer or various other types of computing devices having a processor and memory may be configured to perform method 500.

As described and shown in reference to FIG. 5, method 500 may be utilized for fabricating pre-decoder circuitry in accordance with various schemes and techniques described herein above. At block 510, method 500 may fabricate a first memory cell array having a first number of rows. At block 520, method 500 may fabricate a second memory cell array having a second number of rows. At block 530, method 500 may fabricate a first pre-decoder that selects a first row from the first number of rows based on a row address. At block 540, method 500 may fabricate a second pre-decoder that selects a second row from the second number of rows based on the row address. At block 550, method 500 may fabricate a single row decoder that selects the first row or the second row based on a row selection bit from the row address.

Described herein are various implementations of an integrated circuit. The integrated circuit may include a memory cell array having a first number of rows and a second number of rows. The integrated circuit may include a first pre-decoder that receives a row address and selects a first row from the first number of rows based on the row address. The integrated circuit may include a second pre-decoder that receives the row address from the first pre-decoder and selects a second row from the second number of rows based on the row address received from the first pre-decoder. The integrated circuit may include a single row decoder that receives the row address and selects either the first row or the second row based on a row selection bit from the row address.

Described herein are various implementations of an integrated circuit. The integrated circuit may include multiple bitcell arrays including a first bitcell array and a second bitcell array that is separate from the first bitcell array. The first bitcell array has multiple first rows, and the second bitcell array has multiple second rows. The integrated circuit may include multiple pre-decoders including a first pre-decoder and a second pre-decoder that is separate from the first pre-decoder. The first pre-decoder selects a first row from the first bitcell array, and the second pre-decoder selects a second row from the second bitcell array. The integrated circuit may include a single row decoder that selects the first row or the second row.

Described herein are various implementations of a method. The method may include fabricating a first memory cell array having a first number of rows. The method may include fabricating a second memory cell array having a second number of rows. The method may include fabricating a first pre-decoder that selects a first row from the first number of rows based on a row address. The method may include fabricating a second pre-decoder that selects a second row from the second number of rows based on the row address. The method may include fabricating a single row decoder that selects the first row or the second row based on a row selection bit from the row address.

It should be intended that the subject matter of the claims not be limited to the implementations and illustrations provided herein, but include modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. Moreover, it should be appreciated that such a development effort may be complex and time consuming, but would nevertheless be a routine undertaking of design, fabrication, and manufacture for those of ordinary skill having benefit of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
   a memory cell array having a first number of rows and a second number of rows;
   a first row decoder array coupled to the memory cell array for accessing the first number of rows;
   a second row decoder array coupled to the memory cell array for accessing the second number of rows;
   a first pre-decoder having multiple row pre-decoders including a first row pre-decoder and a second row pre-decoder coupled to the first row decoder array, wherein the first row pre-decoder receives a first part of a first segment of a row address and selects a first row from a first partition of the first number of rows based on the first part of the first segment of the row address, and wherein the second row pre-decoder receives a second part of the first segment of the row address and selects the first row from a second partition of the first number of rows based on the second part of the first segment of the row address, wherein the first segment of the row address comprises multiple parts including the first part, the second part, and a third part, and wherein the multiple row pre-decoders comprise:
   the first row pre-decoder that receives the first part of the row address, decodes the first part, and provides a decoded first part to the first row decoder array for selecting the first row from the first partition of the first number of rows;
   the second row pre-decoder that receives the second part of the row address, decodes the second part, and provides a decoded second part to the first row decoder array for selecting the first row from the second partition of the first number of rows;
   a second pre-decoder coupled to the second row decoder array, wherein the second pre-decoder receives the first segment of the row address from the first pre-decoder and selects a second row from the second number of rows based on the first segment of the row address received from the first pre-decoder;
   a single row decoder coupled directly to the first pre-decoder and the second pre-decoder, wherein the single row decoder receives a second segment of the row address, identifies a row selection bit from the second segment of the row address, and provides a first decoded row selection bit directly to the first pre-decoder or provides a second decoded row selection bit directly to the second pre-decoder to thereby select either the first row or the second row based on the row selection bit from the row address; and
   a first row clock decoder that receives the third part of the row address, receives the row selection bit from the single row decoder, and provides a first decoded row clock to the first row decoder array based on and an internal clock.

2. The integrated circuit of claim 1, wherein the memory cell array is subdivided into multiple arrays including a first array and a second array that is separate from the first array, wherein the first array includes the first number of rows, and wherein the second array includes the second number of rows.

3. The integrated circuit of claim 1, wherein the first number of rows comprises the first partition as a first partition of rows and the second partition as a second partition of rows, and wherein the second number of rows comprises a third partition of rows and a fourth partition of rows, and wherein the first partition of rows, the second partition of rows, the third partition of rows, and the fourth partition of rows are similar in size.

4. The integrated circuit of claim 1, wherein the first number of rows comprises the first partition as a lower-half of the rows of the memory cell array, and wherein the second number of rows comprises the second partition as an upper-half of the rows of the memory cell array.

5. The integrated circuit of claim 1, wherein the first row clock decoder decodes the third part of the row address and provides a decoded third part of the row address.

6. The integrated circuit of claim 1, wherein the first row decoder array receives the decoded first part from the first row pre-decoder, receives the decoded second part from the second row pre-decoder, receives the first decoded row clock signal from the first row clock decoder, and provides a first wordline selection signal to select the first row based on the row selection bit.

7. The integrated circuit of claim 1, further comprising:
a first row address buffer that receives the first part of the row address from the first row pre-decoder, buffers the first part, and provides a buffered first part to the second pre-decoder; and
a second row address buffer that receives the second part of the row address from the second row pre-decoder, buffers the second part, and provides a buffered second part to the second pre-decoder.

8. The integrated circuit of claim 7, further comprising:
a row clock buffer that receives the internal clock, buffers the internal clock, and provides a buffered internal clock to the second pre-decoder; and
a third row address buffer that receives the decoded third part of the row address, buffers the decoded third part, and provides a buffered and decoded third part to the second pre-decoder.

9. The integrated circuit of claim 8, wherein the second pre-decoder comprises:
a third row pre-decoder that receives the buffered first part from the first pre-decoder, decodes the buffered first part, and provides the decoded first part to the second row decoder array for selecting the second row from a third partition of the second number of rows; and
a fourth row pre-decoder that receives the buffered second part from the first pre-decoder, decodes the second part, and provides a decoded second part to the second row decoder array for selecting the second row from a fourth partition of the second number of rows.

10. The integrated circuit of claim 9, further comprising:
a second row clock decoder hat receives the buffered internal clock from the first pre-decoder, receives the buffered and decoded third part of the row address, receives the row selection bit from the single row decoder, and provides a second decoded row clock to the second row decoder array based on the buffered internal clock.

11. The integrated circuit of claim 10, wherein the second row decoder array receives the decoded first part from the third row pre-decoder, receives the decoded second part from the fourth row pre-decoder, receives the second decoded row clock signal from the second row clock decoder, and provides a second wordline selection signal to select the second row based on the row selection bit.

12. The integrated circuit of claim 1, wherein the memory cell array comprises random access memory (RAM) cells.

13. The integrated circuit of claim 12, wherein the RAM cells comprise at least one of static RAM (SRAM) cells and magneto-resistive RAM (MRAM) cells.

14. An integrated circuit, comprising:
multiple bitcell arrays including a first bitcell array, second bitcell array and a third bitcell array, wherein the first bitcell array has multiple first rows, wherein the second bitcell array has multiple second rows, and wherein the third bitcell array has multiple third rows;
multiple row decoders coupled to the multiple bitcell arrays, wherein the multiple row decoders have a first row decoder coupled to the first bitcell array for accessing the multiple first rows, wherein the multiple row decoders have a second row decoder coupled to the second bitcell array for accessing the multiple second rows, and wherein the multiple row decoders have a third row decoder coupled to the third bitcell array for accessing the multiple third rows;
multiple pre-decoders coupled to the multiple row decoders, wherein the multiple pre-decoders have a first pre-decoder, a second pre-decoder and a third pre-decoder, wherein the first pre-decoder is coupled to the first row decoder to select a first row from the first bitcell array, wherein the second pre-decoder is coupled to the second row decoder to select a second row from the second bitcell array, and wherein the third pre-decoder is coupled to the third row decoder to select a third row from the third bitcell array; and
a single row decoder coupled directly to the first pre-decoder, the second pre-decoder and the third pre-decoder, wherein the single row decoder provides a selection signal directly to the first pre-decoder, the second pre-decoder or the third pre-decoder to thereby select the first row, the second row or the third row.

15. The integrated circuit of claim 14, wherein the multiple bitcell arrays comprise a fourth bitcell array that is separate from the first bitcell array, the second bitcell array, and the third bitcell array, and wherein the fourth bitcell array has multiple fourth rows.

16. The integrated circuit of claim 15, wherein the multiple pre-decoders include a fourth pre-decoder that is separate from the first pre-decoder, the second pre-decoder, and the third pre-decoder, wherein the fourth pre-decoder selects a fourth row from the fourth bitcell array, and wherein the single row decoder selects the first row, the second row, the third row or the fourth row.

17. The integrated circuit of claim 14, wherein the multiple bitcell arrays comprise random access memory (RAM) cells.

18. A method, comprising:
fabricating a first memory cell array having a first number of rows;
fabricating a second memory cell array having a second number of rows;
fabricating a first row decoder coupled to the first memory cell array for accessing the first number of rows;
fabricating a second row decoder coupled to the second memory cell array for accessing the second number of rows;
fabricating a first pre-decoder with multiple row pre-decoders including a first row pre-decoder and a second row pre-decoder coupled to the first row decoder, the multiple row pre-decoders having the first row pre-decoder that selects a first row from a first partition of the first number of rows based on a first part of a first segment of a row address, and the multiple row pre-decoders having the second row pre-decoder that selects the first row from a second partition of the first number of rows based on a second part of the first segment of the row address, wherein the first segment of the row address comprises multiple parts including the first part and the second part, and wherein the multiple row pre-decoders comprise:
the first row pre-decoder that receives the first part of the row address, decodes the first part, and provides a decoded first part to the first row decoder array for selecting the first row from the first partition of the first number of rows;
the second row pre-decoder that receives the second part of the row address, decodes the second part, and provides a decoded second part to the first row decoder array for selecting the first row from the second partition of the first number of rows;
fabricating a second pre-decoder coupled to the second row decoder that selects a second row from the second number of rows based on the row address; an-GI
fabricating a single row decoder that is coupled directly to the first pre-decoder and the second pre-decoder, wherein the single row decoder provides a row selection signal directly to the first pre-decoder or the second pre-decoder to thereby select the first row or the second row based on a second segment of the row address;

fabricating a first row address buffer that receives the first part of the row address from the first row pre-decoder, buffers the first part, and provides a buffered first part to the second pre-decoder; and fabricating a second row address buffer that receives the second part of the row address from the second row pre-decoder, buffers the second part, and provides a buffered second part to the second pre-decoder.

19. The method of claim 18, wherein:

the multiple row pre-decoders comprise the first row pre-decoder and the second row pre-decoder coupled to the first row decoder that selects the first row from the first partition and the second partition of the first number of rows based on the row address, and the second pre-decoder comprises a third row pre-decoder and a fourth row pre-decoder coupled to the second row decoder that selects the second row from a third partition or a fourth partition of the second number of rows based on the row address.

* * * * *